US011824321B2

(12) United States Patent
Nagai et al.

(10) Patent No.: US 11,824,321 B2
(45) Date of Patent: Nov. 21, 2023

(54) METHOD OF FABRICATING TUBULAR LASER LIGHT SOURCE, TUBULAR LASER LIGHT SOURCE AND DETECTION DEVICE USING TUBULAR LASER LIGHT SOURCE

(71) Applicant: SHIMADZU CORPORATION, Kyoto (JP)

(72) Inventors: Yusuke Nagai, Kyoto (JP); Kotaro Kajikawa, Tokyo (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 17/879,826

(22) Filed: Aug. 3, 2022

(65) Prior Publication Data

US 2022/0376460 A1    Nov. 24, 2022

Related U.S. Application Data

(62) Division of application No. 16/771,297, filed as application No. PCT/JP2018/023415 on Jun. 20, 2018, now abandoned.

(30) Foreign Application Priority Data

Dec. 19, 2017  (JP) ................. 2017-242478

(51) Int. Cl.
*H01S 3/20* (2006.01)
*H01S 3/16* (2006.01)
(Continued)

(52) U.S. Cl.
CPC ............ *H01S 3/168* (2013.01); *H01S 3/1086* (2013.01); *H01S 3/213* (2013.01); *H01S 3/2358* (2013.01);
(Continued)

(58) Field of Classification Search
CPC ........ H01S 3/168; H01S 3/1086; H01S 3/213; H01S 3/2358; H01S 3/307; H01S 5/36; H01S 3/094034; H01S 5/042; H01S 3/23
See application file for complete search history.

(56) References Cited

U.S. PATENT DOCUMENTS 3,466,568 A * 9/1969 Adam .................... H01S 3/213
                                                    372/51
3,753,146 A * 8/1973 Reynolds ................ H01S 3/213
                                                    372/71

(Continued)

FOREIGN PATENT DOCUMENTS

CN        107300789 A       10/2017
WO    2016/170670 A1       10/2016

OTHER PUBLICATIONS

International Search Report with respect to International Patent Application No. PCT/JP2018/023415, dated Aug. 21, 2018.

(Continued)

*Primary Examiner* — Kinam Park
(74) *Attorney, Agent, or Firm* — Renner, Otto, Boisselle & Sklar, LLP

(57) ABSTRACT

A tube preparation step of preparing a resin tube that has a tube wall impregnable with a solution including a fine substance and is made of a light-transmitting resin material, a solution preparation step of preparing a solution that includes a fine fluorescent substance that emits fluorescence or a fine scattering substance that scatters light as an oscillation material and an impregnation step of causing the resin tube to be immersed in the solution and causing the tube wall of the resin tube to be impregnated with the oscillation material, are included.

3 Claims, 6 Drawing Sheets

(51) Int. Cl.
- *H01S 5/36* (2006.01)
- *H01S 3/213* (2006.01)
- *H01S 3/23* (2006.01)
- *H01S 3/108* (2006.01)
- *H01S 3/30* (2006.01)
- *G01N 15/06* (2006.01)
- *G01N 21/05* (2006.01)
- *G01N 21/64* (2006.01)
- *H01S 5/042* (2006.01)
- *H01S 3/094* (2006.01)

(52) U.S. Cl.
CPC ............. *H01S 3/307* (2013.01); *H01S 5/36* (2013.01); *G01N 15/06* (2013.01); *G01N 21/05* (2013.01); *G01N 21/6402* (2013.01); *G01N 2015/0693* (2013.01); *G01N 2201/06113* (2013.01); *H01S 3/094034* (2013.01); *H01S 5/042* (2013.01)

(56) References Cited

U.S. PATENT DOCUMENTS

| | | | | |
|---|---|---|---|---|
| 4,672,617 | A * | 6/1987 | Hansen | H01S 3/2383 372/54 |
| 6,276,217 | B1 * | 8/2001 | Hirano | G01P 5/001 73/861.05 |
| 2004/0120374 | A1 * | 6/2004 | Duarte | H01S 3/168 372/39 |
| 2009/0003882 | A1 * | 1/2009 | Nakamura | B41J 2/45 313/504 |
| 2009/0201952 | A1 * | 8/2009 | Luo | H01S 3/10092 372/5 |
| 2018/0166605 | A1 * | 6/2018 | Nagai | H01L 31/1828 |

OTHER PUBLICATIONS

Written Opinion of the International Searching Authority with respect to International Patent Application No. PCT/JP2018/023415 (English Machine Translation), dated Aug. 21, 2018.

"Dye-doped polymer microring laser coupled with stimulated resonant Raman scattering", H. Yanagi, R. Takeaki, S. Tomita, A. Ishizumi, F. Sasaki, K. Yamashita and K. Oe, Appl. Phys. Lett. 95, 03306 (2009); published online Jul. 21, 2009. (Cited in Specification).

"Lasing of whispering gallery modes in optofluidic microcapillaries", A. François, N. Riesen, K. Gardner, T. M. Monro and A. Meldrum, Opt. Express, 24(12), 12466-12477 (2016); May 31, 2016. (Cited in Specification).

"Multimode laser emission from free-standing cylindrical microcavities", J. Peter, P. Radhakrishnan, V. P. N. Nampoori and M. Kailasnath, Journal of Luminescence, 149, 204-207 (2014); available online Jan. 15, 2014. (Cited in Specification).

"Ultimate quality factor of silica microtoroid resonant cavities", X. Zhang, H. S. Choi and A. M. Armani, Appl. Phys. Lett. 96 (2010) 153304; published online Apr. 15, 2010. (Cited in Specification).

Notice of Reasons for Refusal in corresponding Chinese Patent Application No. 201880076852.5, with English achine translation.

Notice of Reasons for Refusal in corresponding Chinese Patent Application No. 201880076852.5 dated May 20, 2023, with English machine translation.

Notice of Reasons for Refusal in corresponding Chinese Patent Application No. 201880076852.5 dated Sep. 9, 2023, with English machine translation.

* cited by examiner

F I G. 6
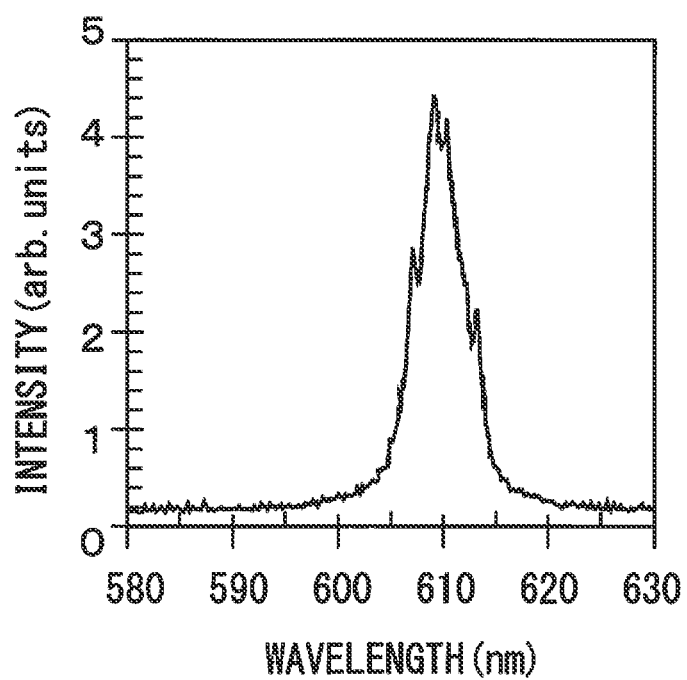

METHOD OF FABRICATING TUBULAR LASER LIGHT SOURCE, TUBULAR LASER LIGHT SOURCE AND DETECTION DEVICE USING TUBULAR LASER LIGHT SOURCE

CROSS-REFERENCE TO RELATED APPLICATIONS

This is a divisional under 35 USC § 121 of co-pending U.S. application Ser. No. 16/771,297, filed Jun. 10, 2020, which is a 35 USC § 371 national stage application of International Application No. PCT/JP2018/023415, filed Jun. 20, 2018, which claims priority to Japanese Application No. 2017-242478, filed Dec. 19, 2017, the entire disclosures of which are incorporated herein by reference.

TECHNICAL FIELD

The present invention relates to a tubular laser light source that can have functions as a light source and a measurement cell in a detection device for a liquid chromatograph, for example, a method of fabricating the tubular laser light source and the detection device using such a tubular laser light source.

BACKGROUND ART

In an analysis device such as a liquid chromatograph, an absorptiometer, a differential refractometer or the like is often used as a detection device. Such a detection device includes at least a light source (1), a measurement cell (2) through which a sample flows, a detector (3) for detecting light from the measurement cell, an optical system (4) for leading light from the light source to the measurement cell and an optical system (5) for leading light from the measurement cell to the detector. The presence of such a large number of elements has limited miniaturization of the detection device.

As such, the inventors of the present invention suggest that reductions in size and weight of the detector be realized by the following steps. The inventors of the present invention suggest that, a flow path through which a sample passes be formed inside of a base made of sapphire, etc. that is used as a base material for a light-emitting diode or laser diode, and the light source and the detector be formed on the base with use of semi-conductor processing such that the flow path is provided therebetween. Thus, the above-mentioned optical systems (4) and (5) are not provided, and the light sources (1) and the measurement cell (2) and the detector (3) are integrated, for reductions in size and weight of the detection device (see Patent Document 1.)
[Patent Document 1] WO 2016/170670 A

NON-PATENT DOCUMENT

[Non-patent Document 1] H. Yanagi, R. Takeaki, S. Tomita, A. Ishizumi, F. Sasaki, K. Yamashita and K. Oe, "Dye-doped polymer microring laser coupled with stimulated resonant Raman scattering," Appl. Phys. Lett., 95, 03306 (2009).
[Non-patent Document 2] A. François, N. Riesen, K. Gardner, T. M. Monro and A. Meldrum, "Lasing of whispering gallery modes in optofluidic microcapillaries," Opt. Express, 24(12), 12466-12477 (2016).
[Non-patent Document 3] J. Peter, P. Radhakrishnan, V. P. N. Nampoori and M. Kailasnath, "Multimode laser emission from free-standing cylindrical microcavities," J. Lumin., 149, 204-207 (2014).
[Non-patent Document 4] X. Zhang, H. S. Choi and A. M. Armani, "Ultimate quality factor of silica microtoroid resonant cavities," Appl. Phys. Lett. 96 (2010) 153304.

SUMMARY OF INVENTION

Technical Problem

While it is possible to realize reductions in size and weight of the detector by using the technique described in Patent Document 1 mentioned above, advanced manufacturing processing is required.

An object of the present invention is to provide a technique for enabling a light-weight and small-size detector to be configured without using advanced manufacturing processing.

Solution to Problem

The inventors of the present invention obtained new findings that a resin tube can be configured as a WGM (Whispering Gallery Mode) laser or a random laser that oscillates laser light by impregnation of a tube wall of the resin tube with an oscillation material. The oscillation material is a gain medium that can obtain a gain when being irradiated with excitation light (a fluorescent substance that emits fluorescence, for example) or a scattering substance that scatters a gain medium and light (the gain medium and the scattering substance may have the same function.)

In a case where the tube wall of the resin tube is impregnated with a fluorescent substance used as an oscillation material, when the fluorescent substance in the tube wall is excited, the light having a specific wavelength of the fluorescence emitted from the fluorescent substance repeats total reflection at the interface between the tube wall of the resin tube and an air layer to be oscillated. As a result, when the fluorescent substance is irradiated with the excitation light having certain intensity or higher, the light having the specific wavelength is oscillated outwardly from inside of the tube wall of the resin tube as laser light. The wavelength of the laser light oscillated in the resin tube depends on the wavelength of fluoresce emitted from the fluorescent substance, the inner and outer diameters of the resin tube and the refractive index in the tube wall. Therefore, it is possible to oscillate the laser light having a desired wavelength by adjusting not only the type or concentration of the fluorescent substance with which the resin tube is impregnated but also the inner and outer diameters of the resin tube, the refractive index inside of the tube wall and the refractive index outside of the tube.

In a case where the tube wall of the resin tube is impregnated with a scattering substance used as an oscillation material, when the scattering substance in the tube wall is irradiated with light from the outside, the fluorescence excited by the light is scattered by the scattering substance, and the light having a specific wavelength repeats multiple scattering or reflection at the interface between an inner portion and tube wall of the resin tube, and an air layer to be oscillated. As a result, when the scattering substance is irradiated with light having certain intensity or higher, the light having the specific wavelength is oscillated outwardly from the inside of the tube wall of the resin tube as laser light.

Since the sample can pass through the resin tube having the tube wall that has been impregnated with the oscillation material, the resin tube can have both of the functions as a measurement cell through which the sample passes and a light source that irradiates the sample with light in the detection device.

Meanwhile, it is suggested in Non-patent Documents 1 and 2 that an inner or outer surface of a cylindrical support member such as a glass capillary be coated with resin including fluorescent dye, and that a ring-shaped dye laser light source be fabricated. However, it is not easy to uniformly coat the outer or inner surface of such a support member with the resin including fluorescent dye in addition to preparing the cylindrical support member such as a glass capillary. Although it is suggested in Non-patent Document 3 that the resin including fluorescent dye be poured into a mold to form a tubular laser light source by resin molding, large-scale equipment such as a mold device for resin molding is required, and it cannot be said that fabrication is easy.

The method of manufacturing a tubular laser light source according to the present invention enables a tubular laser light source to be fabricated more easily compared to the technique disclosed in the Non-patent Documents 1-3, includes a tube preparation step of preparing a resin tube that has a tube wall impregnable with a solution including a fine substance and is made of a light-transmitting resin material, a solution preparation step of preparing a solution that includes a fine fluorescent substance that emits fluorescence or a fine scattering substance that scatters light as an oscillation material, and an impregnation step of causing the resin tube to be immersed in the solution and causing the tube wall of the resin tube to be impregnated with the oscillation material. The tubular laser light source fabricated by these steps oscillates the laser light outwardly of the tube wall based on the light emitted from the fluorescent substance or scattered by the scattering substance.

A refractive index adjusting substance for adjusting a refractive index in the tube wall may be included in the solution in the solution preparation step, and the tube wall may be impregnated with the refractive index adjusting substance together with the oscillation material in the impregnation step, in the method of the present invention. In a case where the tube wall of the resin tube is impregnated with the refractive index adjusting substance, and the refractive index in the tube wall is increased, a Q value of a resonator is increased, and the threshold value for oscillating laser light can be lowered (See Non-patent Document 4.) Further, as described above, the wavelength of the laser light oscillated from the tubular laser light source also depends on the refractive index in the tube wall of the resin tube. Thus, it is possible to change the wavelength of the laser light oscillated from the tubular laser light source without changing the type of the fluorescent substance or the dimension of the resin tube by causing the tube wall to be impregnated with the refractive index adjusting substance together with the oscillation material.

One example of the resin tube is an acrylic acid tube.

The tubular laser light source according to the present invention is fabricated by the above-mentioned fabrication method. Specifically, a tubular laser light source according to the present invention is configured to oscillate laser light outwardly of a tube wall from an inside of the tube wall based on light emitted from a fluorescent substance or scattered by a scattering substance, wherein the tube wall is impregnable with a solution including a fine substance, and the tube wall of a resin tube made of a light-transmitting resin material is impregnated with a fine fluorescent substance that emits fluorescence or a fine scattering substance that scatters light as an oscillation material.

In the tubular laser light source of the present invention, the tube wall is preferably impregnated with a refractive index adjusting substance for adjusting a refractive index in the tube wall together with the oscillation material. In a case where the refractive index in the tube wall is increased by the refractive index adjusting substance, the Q value of the resonator is increased, the threshold value for oscillating the laser beam is lowered, and the laser light can be oscillated with smaller energy.

An organic EL material (2,5-dioctyloxy poly (p-phenylene vinylene): DOO-PPV, for example) can be used as the oscillation material. In this case, it is possible to excite the organic EL material by a current injection method by providing a voltage applier that applies a voltage to excite the organic EL material to a portion between an inner surface and an outer surface of the resin tube, and a light source for irradiation with excitation light from the outside becomes unnecessary.

The detection device according to the present invention includes a measurement cell configured such that a sample flows through an inner flow path of the above-mentioned tubular laser light source, an oscillator that causes the tubular laser light source to oscillate laser light, a detector that detects measurement light emitted outwardly of a tube wall of the tubular laser light source, and a calculator configured to carry out quantitative analysis of concentration of a component of the sample flowing through the inner flow path of the tubular laser light source or qualitative analysis of a type of the sample based on intensity or a wavelength of the measurement light detected by the detector.

Here, the measurement light detected by the detector does not only mean the light having the same wavelength as that of the light oscillated in the tubular laser light source. In a case where the absorbance of the sample flowing through the measurement cell is to be obtained, when the light having a specific wavelength oscillated in the tubular laser light source is transmitted through the tube and sample, the intensity of the light is detected, and then the change amount is measured. Therefore, the light having the same wavelength oscillated in the tubular laser light source is the measurement light. In a case where the wavelength of the oscillated laser light is not a single wavelength, there is a concern that an amount of the component of stray light is increased and the linearity is degraded. However, there is no problem in measuring the total amount of light and calculating the absorbance (unnecessary light may be removed by an optical filter). In a case where Raman scattering light intensity of the sample flowing through the tube is to be obtained, the light having the wavelength oscillated in the tubular laser light source is used as excitation light for causing Raman scattering to occur. In this case, since the scattering light from the component of the excited sample includes a wavelength different from that of the light oscillated in the tubular laser light source, the measurement light is the light that has a wavelength different from that of the light oscillated in the tubular laser light source.

As one preferred embodiment of the above-mentioned detection device, the measurement cell is configured such that a plurality of the tubular laser light sources configured to oscillate laser light rays that are different from one another are in fluid connection with one another in series, the detector has a detection element that detects measurement light from each of the plurality of tubular laser light sources, and the calculator is configured to obtain concentration of a component of a sample flowing through an inner flow path of the tubular laser light source based on intensity or a wavelength of each measurement light detected by the detection element of the detector. With such a configuration, a sample flowing through the measurement cell can be irradiated with the plurality of types of light rays having wavelengths to be measured. Alternatively, a flow path in which a plurality of tubes are put together can be fabricated, and the concentration of a component can be measured. Since a tube is transparent, the oscillated laser light is transmitted.

Advantageous Effects of Invention

With the method of fabricating a tubular laser light source according to the present invention, a resin tube and a solution including an oscillation material are prepared. Then, the resin tube is merely immersed in the solution, and a tube wall of the resin tube is merely impregnated with the oscillation material. Thus, the tubular laser light source can be easily fabricated.

Since being fabricated by the above-mentioned fabrication method, the tubular laser light source according to the present invention is easily fabricated. Furthermore, since being used not only as a light source but also as a flow path through which liquid flows, the tubular laser light source can have both of the functions as a light source and a measurement cell in the detection device. This contributes to a reduction in weight and miniaturization of the detection device.

Because the detection device according to the present invention uses the above-mentioned tubular laser light source as a light source and a measurement cell, the number of members is reduced as compared to a conventional detection device, and a light-weight, small-sized and inexpensive detection device can be realized.

BRIEF DESCRIPTION OF THE DRAWINGS

FIG. 6 is an oscillation wavelength spectrum of a tubular laser light source (random laser) fabricated by impregnation of a tube wall of a resin tube with DCM and 5CB.

DESCRIPTION OF EMBODIMENTS

Figure 1:
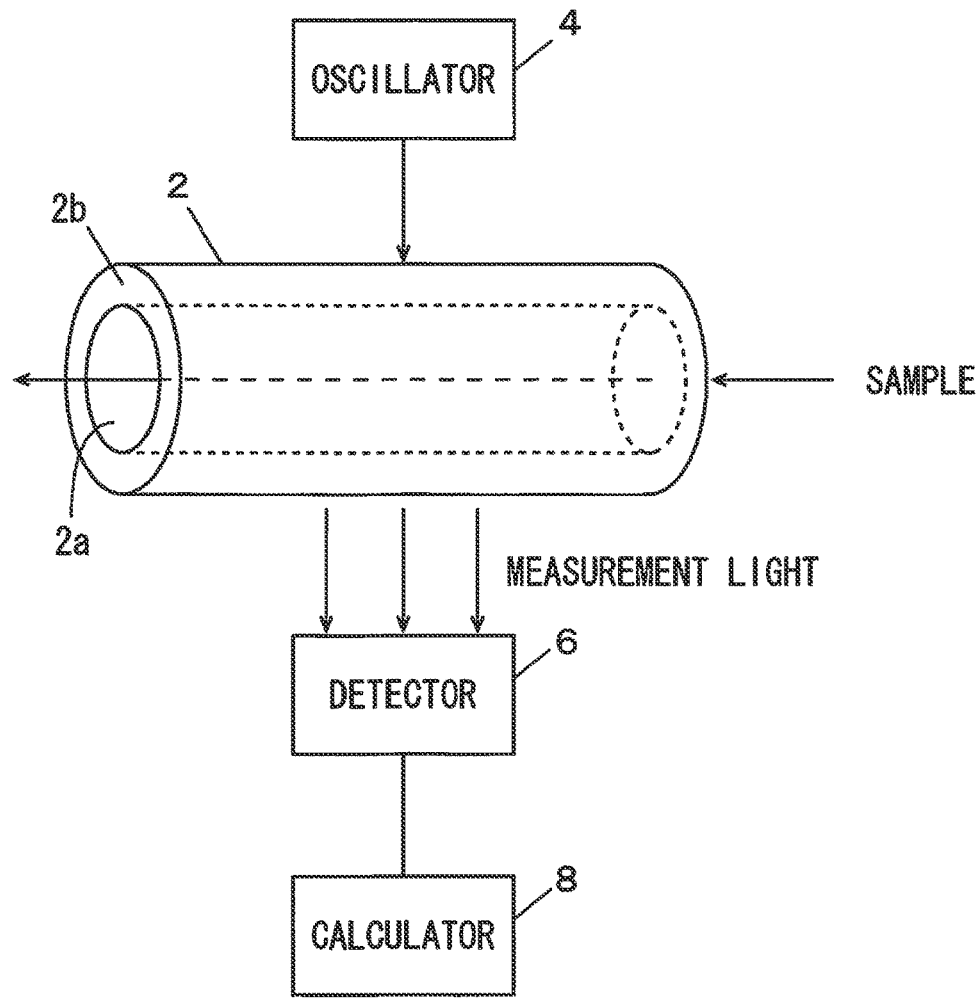
FIG. 1 is a schematic diagram showing the configuration of one inventive example of a detection device using a tubular laser light source.

FIG. 1 shows one inventive example of a detection device using a tubular laser light source.

Figure 2:
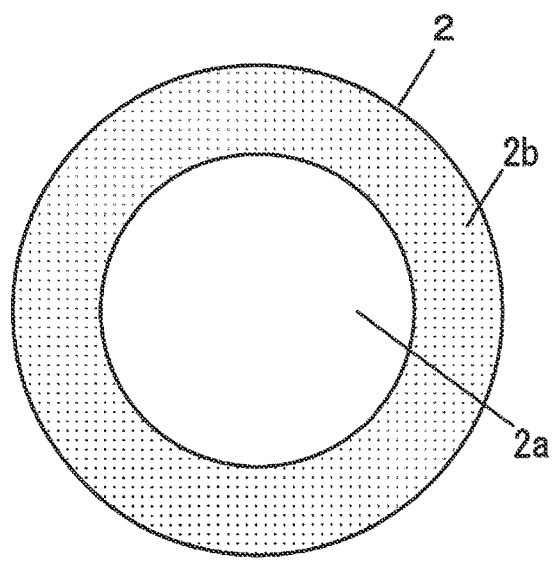
FIG. 2 is a cross sectional view of the tubular laser light source of the same inventive example.

The detection device of this inventive example uses the tubular laser light source 2 as a measurement cell through which a sample passes. As shown in FIG. 2, the tubular laser light source 2 has a tube wall 2b, of a resin tube made of a light-transmitting material, that is impregnated with an oscillation material. The oscillation material includes a fine fluorescent substance that emits fluorescence or a fine scattering substance that scatters light.

In a case where the oscillation material is a fluorescent substance, when the fluorescent substance in the tube wall 2b is excited, the light having a specific wavelength of the fluorescence emitted from the fluorescent substance repeats total reflection at the interface between the tube wall 2b of the tubular laser light source 2 and an air layer, thereby being oscillated. As a result, when the fluorescent substance is irradiated with excitation light having certain intensity or higher, the light having the specific wavelength is oscillated outwardly from the inside of the tube wall 2b of the tubular laser light source 2 as laser light. On the other hand, in a case where the oscillation material is a scattering substance, when the scattering substance in the tube wall 2b is irradiated with light from the outside, the fluorescence excited by the light is scattered by the scattering substance. Further, the light having the specific wavelength is repeatedly reflected from the interface between the tube wall 2b of the tubular laser light source 2 and an air layer or repeats multiple scattering in the tube, thereby being oscillated. As a result, in a case where the scattering substance is irradiated with light having certain intensity or higher, the light having the specific wavelength is oscillated outwardly from the inside of the tube wall 2b of the tubular laser light source 2 as laser light.

Returning to FIG. 1, an oscillator 4 causes the tubular laser light source 2 to oscillate laser light by utilizing the oscillation material in the tube wall 2b of the tubular laser light source 2. In a case where the oscillation material with which the tube wall 2b is impregnated is a fluorescent substance, an excitation light source that emits excitation light for exciting the fluorescent substance is cited as the oscillator 4.

While one example of the fluorescent substance is DCM (4-(dicyanomethylene)-2-methyl 6-(4-dimethylaminostyryl)-4H-pyran), any fine substance that emits fluorescence when being excited can be used.

An organic EL material such as DOO-PPV (2,5-dioctyloxy poly (p-phenylene vinylene)) can also be used as a fluorescent substance. The oscillator 4 in this case includes a voltage applier configured to apply a voltage from both of the inner surface and the outer surface of the tubular laser light source 2 to excite the organic EL material by using a current injection system.

On the other hand, in a case where the oscillation material with which the tube wall 2b is impregnated is a scattering substance, a light source for irradiating a scattering substance with light having any wavelength can be used as the oscillator 4. Although one example of a scattering substance includes submicron to micron-order bubbles present inside of the tube, fogging caused by intentional degradation of resin, and nanoparticles of a size (100 nm or less in diameter) with which the resin tube can be impregnated, any substance can be used as long as the substance is fine and scatters light.

A detector 6 is used to detect the measurement light emitted from the tubular laser light source 2. Although being realized by a photodiode, for example, the detector 6 may include a filter for extracting the light serving as the measurement light, a spectrometer and the like.

A calculator 8 is configured to obtain absorbance, the refractive index, Raman scattering light intensity, etc. of the sample flowing through an inner flow path 2a of the tubular laser light source 2 based on a measurement value of intensity of the measurement light detected by the detector 6. The calculator 8 is the function obtained when an arithmetic element executes a predetermined program in a dedicated computer or a general-purpose personal computer.

In a case where the light that has the specific wavelength and has been oscillated in the tubular laser light source 2 is detected by the detector 6 as the measurement light, and a change amount (an amount of decrease) is obtained, the absorbance of the sample flowing through the inner flow path 2a of the tubular laser light source 2 can be obtained.

Further, it is possible to obtain the Raman scattering light intensity of the sample by using the light having the same wavelength as that of the light oscillated in the tubular laser light source 2 as the excitation light and measuring the light having a wavelength different from the oscillation wavelength generated from the component of the excited sample.

Next, the method of fabricating the tubular laser light source 2 will be described with reference to FIG. 3.

A resin tube 2 (FIG. 3A) that can be impregnated with the solution including a fine oscillation material such as a fluorescent substance or a scattering substance and is made of a light-transmitting material, and the solution 10 (FIG. 3B) including an oscillation material, are prepared. Here, light transmissivity means that it does not absorb the light having the wavelength used for measurement (transmittance of 99% or more, for example). An acrylic acid tube or a PMMA (methyl polymethacrylate) tube can be used as the resin tube 2, for example. The solution 10 including an oscillation material is the mixture of an oscillation material such as DCM or DOO-PPV with a solvent such as 2-ethoxyethyl acetate or acetone. The solution 10 may include a plurality of types of oscillation materials. It is possible to make a tube be bendable by fabricating the tube using acrylic acid or the like. In a case where being used for analysis with a flow path such as a liquid chromatograph, the present laser can be installed in more places (the laser can also be used as a pipe).

Figure 3A:
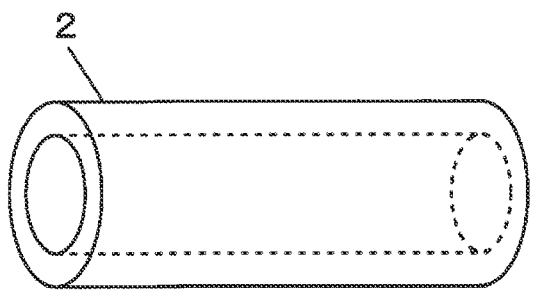
FIGS. 3A-3D are diagrams showing a method of fabricating the tubular laser light source in each step.
Figure 3B:
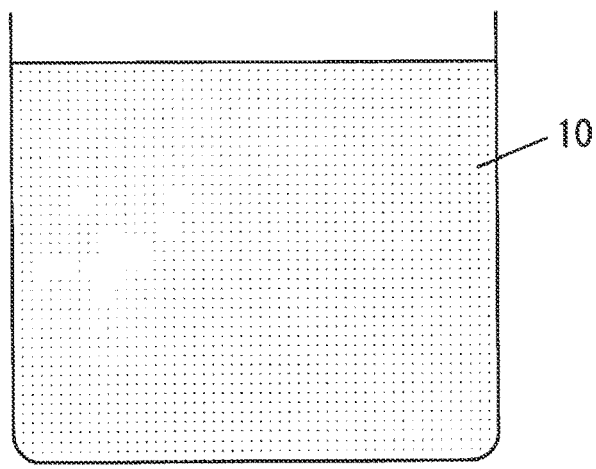
Figure 3C:
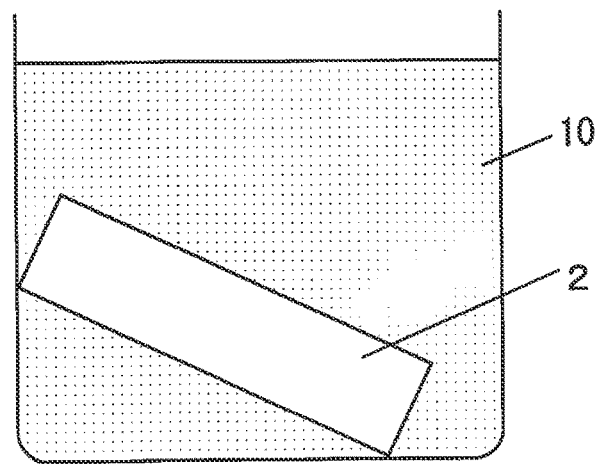
Figure 3D:
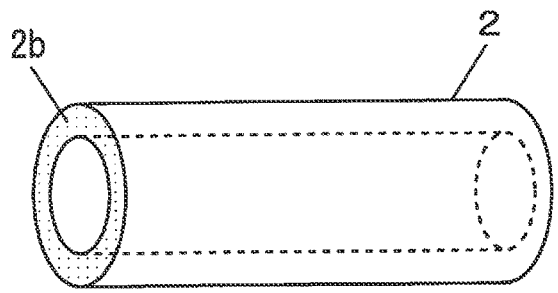

The resin tube 2 is immersed in the solution 10 including an oscillation material for a certain period of time (one hour, for example) (FIG. 3C), and the tube wall 2b of the resin tube 2 is impregnated with the oscillation material (FIG. 3D).

The oscillation material with which the tube wall 2b is to be impregnated is selected such that the light having a wavelength corresponding to the measurement purpose is oscillated in the tubular laser light source 2. The wavelength of the light oscillated in the tubular laser light source 2 is determined based on the inner and outer diameters of the tubular laser light source 2, the refractive index in the tube wall 2b and so on in addition to the type of the oscillation material. The refractive index in the tube wall 2b can be adjusted by impregnation of the tube wall 2b with a nematic liquid crystal (5CB:4-cyano-4'-npentylbiphenyl), for example, as a refractive index adjusting substance together with the oscillation material. As the refractive index adjusting substance, a smectic liquid crystal, a polymer liquid having a high viscosity or the like can be used in addition to the nematic liquid crystal.

In a case where the refractive index in the tube wall 2b is increased by impregnation of the tube wall 2b with a refractive index adjusting substance such as a liquid crystal, a Q value of a resonator is increased. Thus, a threshold value for oscillating laser light can be lowered. Further, it is possible to change the wavelength of the laser light oscillated in the tubular laser light source 2 without changing the type of a fluorescent substance or the dimension of the resin tube.

Figure 4A:
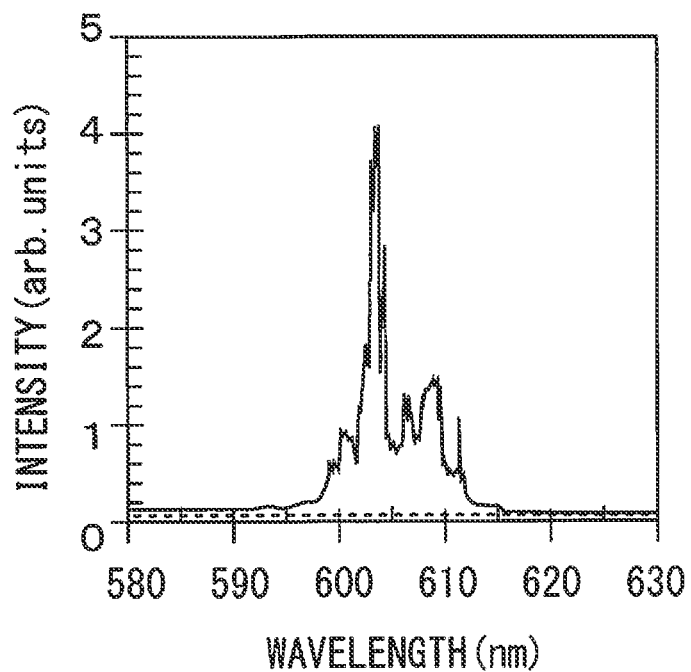
FIG. 4A is a graph showing an oscillation wavelength spectrum of the tubular laser light source fabricated by impregnation of a tube wall of a resin tube with DCM.
Figure 4B:
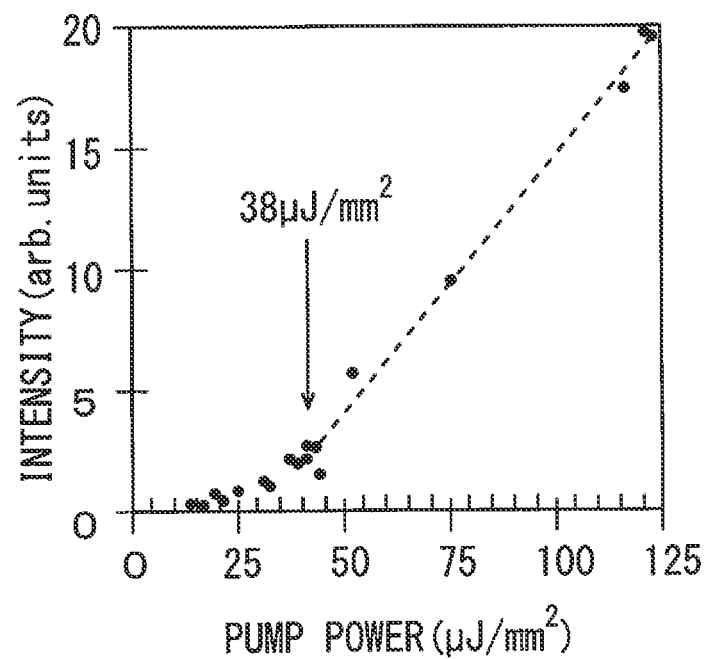
FIG. 4B is a graph showing the energy required for laser oscillation.
Figure 5A:
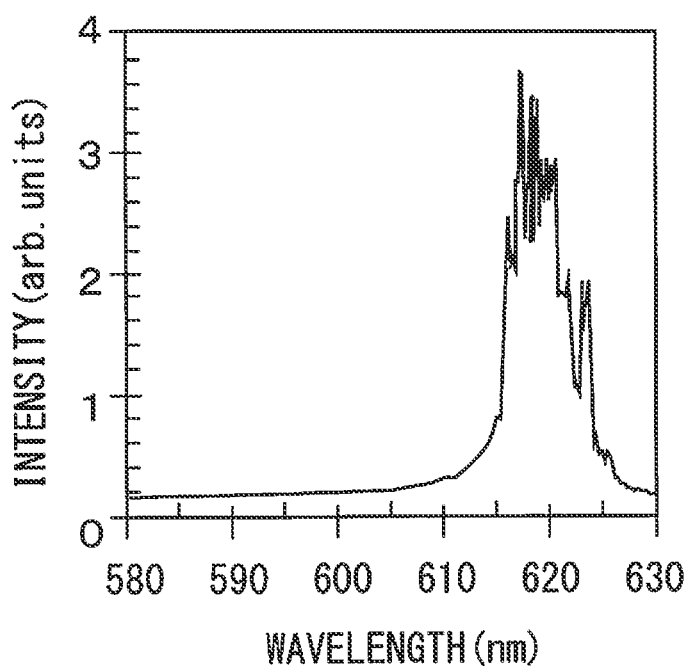
FIG. 5A is a graph showing an oscillation wavelength spectrum of a tubular laser light source fabricated by impregnation of a tube wall of a resin tube with DCM and 5CB.
Figure 5B:
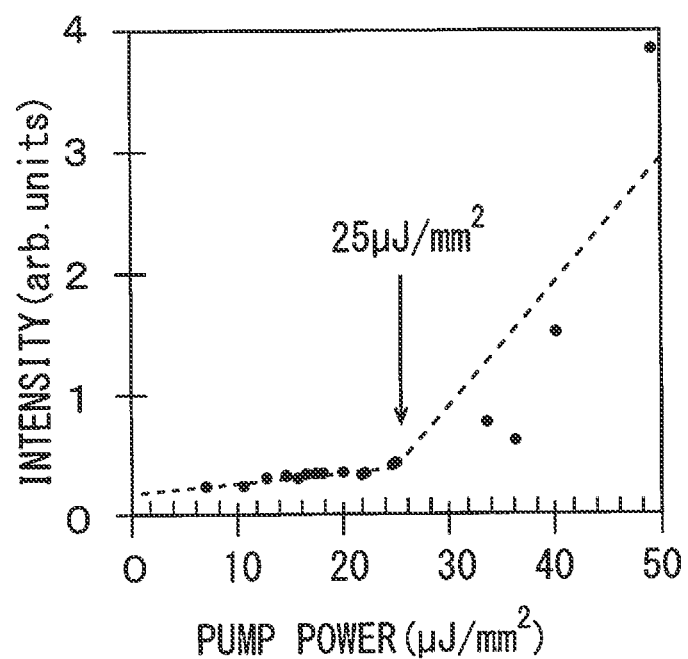
FIG. 5B is a graph showing the energy required for laser oscillation.

Each of FIGS. 4 and 5 shows the measurement data of the tubular laser light source (FIG. 4) that is fabricated by impregnation of the tube wall 2b with DCM as an oscillation material, and the measurement data of the tubular laser light source (FIG. 5) fabricated by impregnation of the tube wall 2b with a liquid crystal (5CB) as a refractive index adjusting substance. Each of FIGS. 4A and 5A shows the oscillation wavelength spectrum, and each of FIGS. 4B and 5B shows the energy required for laser oscillation.

When FIG. 4A and FIG. 5A are compared to each other, in a case where the tube wall 2b is not impregnated with 5CB (FIG. 4A), which is a refractive index adjusting substance, the oscillation wavelength is about 603 nm. On the contrary, in a case where the tube wall 2b is impregnated with 5CB (FIG. 5A), the oscillation wavelength is changed to about 617 nm. From this comparison, it is found that it is possible to adjust the oscillation wavelength by changing the refractive index in the tube wall 2b by using a refractive index adjusting substance.

Further, when FIG. 4B and FIG. 5B are compared to each other, in a case where the tube wall 2b is not impregnated with 5CB, the threshold value for laser oscillation is 38 $\mu J/mm^2$. On the contrary, in a case where the tube wall 2b is impregnated with 5CB, the threshold value for laser oscillation is lowered to 25 $\mu J/mm^2$. From this comparison, it is found that it is possible to lower the threshold value for laser oscillation by increasing the refractive index in the tube wall 2b by using a refractive index adjusting substance.

FIG. 6 shows the measurement data of the tubular laser light source that carries out random laser oscillation, the tubular laser light source being fabricated in a case where a tube having a tube wall 2b that is impregnated with DCM/5CB as an oscillation material is fabricated, resin is degraded such that transparency of the tube is reduced, and then resin becomes a scattering substance. The intensity of excitation light is 1350 $\mu J/mm^2$, and the excitation light having higher intensity is required as compared to that of the tubular laser light source of FIG. 5. This is the measurement data in regard to laser oscillation utilizing multiple scattering that occurs among scatters. Thus, a Q value is lower and the threshold value is higher as compared to the above-mentioned WGM laser.

Figure 7:
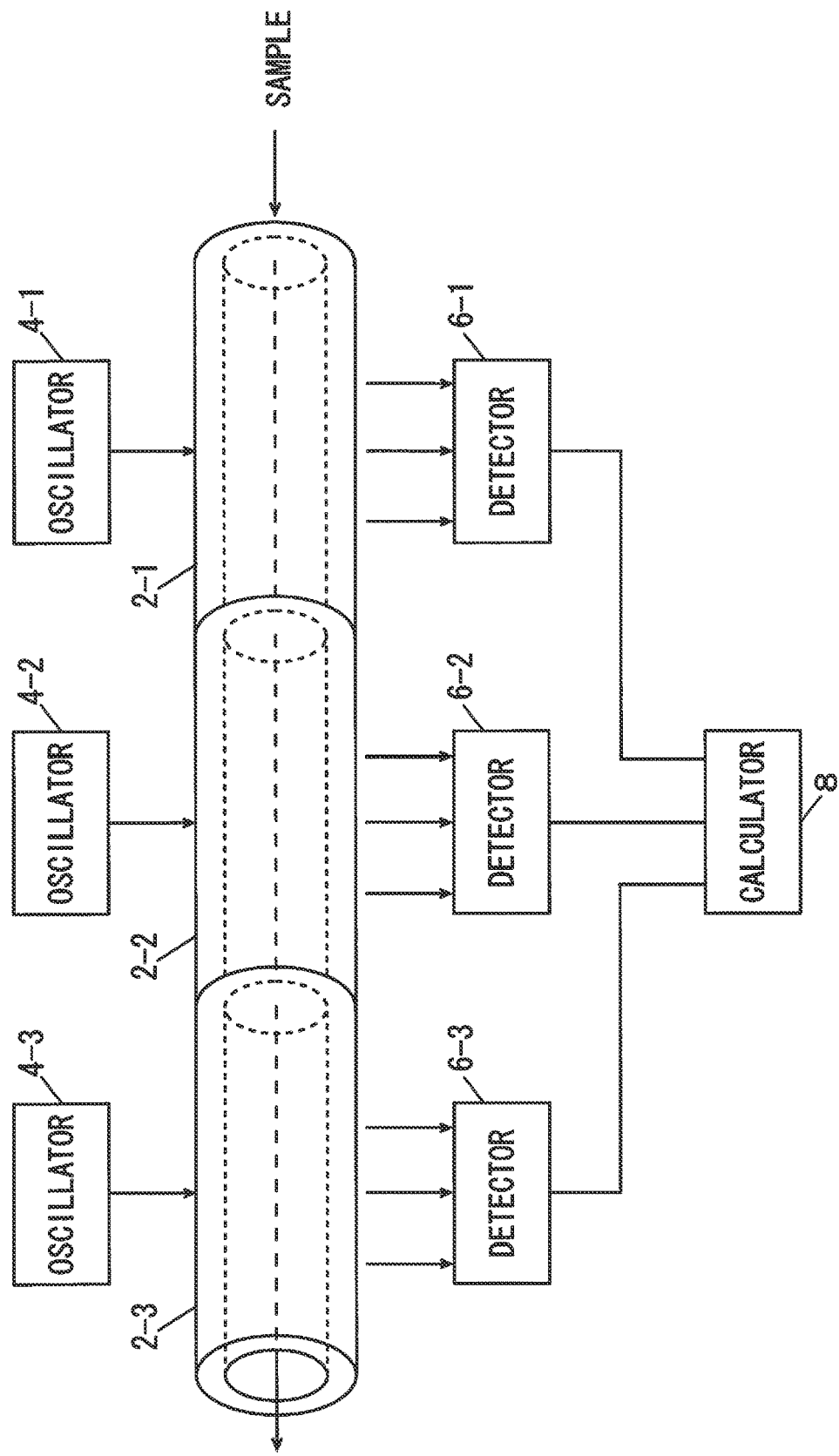
FIG. 7 is a schematic diagram showing the configuration of another inventive example of a detection device using a tubular laser light source.

Next, an application example in which a plurality of tubular laser light sources 2 are used will be described with reference to FIG. 7.

In this inventive example, three tubular laser light sources 2-1 to 2-3 are in fluid connection with one another in series to constitute a measurement cell through which a sample passes. The sample sequentially flows through respective inner flow paths from the most upstream tubular laser light source 2-1 to the most downstream tubular laser light source 2-3. The type of the oscillation material, and presence or absence of a refractive index adjusting substance, or the type of a refractive index adjusting substance are adjusted such that the tubular laser light sources 2-1 to 2-3 oscillate the laser light rays having wavelengths that are different from one another. The number of tubular laser light sources may be any number, and may be two, four or more than four.

Further, oscillators 4-1 to 4-3 for causing each of the tubular laser light sources 2-1 to 2-3 to carry out laser oscillation, and detectors 6-1 to 6-3 for detecting the measurement light from the tubular laser light sources 2-1 to 2-3 are provided. The signals obtained by the detectors 6-1 to 6-3 are configured to be acquired by a common calculator 8.

As described above, the measurement cell is constituted by the plurality of tubular laser light sources 2-1 to 2-3 that oscillate laser light rays having wavelengths that are different from one another. Thus, the measurement can be carried out at a time in regards to the light rays having a plurality of wavelengths. The inventive example of FIG. 7 is merely one example of an embodiment in which a plurality of tubular laser light sources 2 are used.

In this manner, the tubular laser light source 2 of the present invention, which is easily fabricated and simply configured, can be not only provided with the both functions of the light source and the measurement cell in the detection device but also can be used for various purposes using a combination of the plurality of tubular laser light sources 2.

While the description has been made on the assumption that the sample flowing through the inner flow path of the tubular laser light source 2 is irradiated with laser light oscillated by the tubular laser light source in the above-mentioned inventive example, the present invention is not limited to such a purpose. The present invention may be configured to irradiate another object with the laser light oscillated by the tubular laser light source 2.

DESCRIPTION OF REFERENCE NUMERALS

2, 2-1, 2-2, 2-3 Tubular Laser Light Sources (Resin Tubes)
2*a* Inner Flow Path
2*b* Tube Wall
4, 4-1, 4-2, 4-3 Oscillators
6, 6-1, 6-2, 6-3 Detectors
8 Calculator
10 Solution Including oscillation material

The invention claimed is:

1. A method of fabricating a tubular laser light source that oscillates laser light outwardly of a tube wall based on light emitted from a fluorescent substance or scattered by a scattering substance, including:
    a tube preparation step of preparing a resin tube that has the tube wall impregnable with a solution including a fine substance and is made of a light-transmitting resin material;
    a solution preparation step of preparing a solution that includes a fine fluorescent substance that emits fluorescence or a fine scattering substance that scatters light as an oscillation material; and
    an impregnation step of causing the resin tube to be immersed in the solution and causing the tube wall of the resin tube to be impregnated with the oscillation material.

2. The method of fabricating a tubular laser light source according to claim 1, wherein
    a refractive index adjusting substance for adjusting a refractive index in the tube wall is included in the solution in the solution preparation step, and
    the tube wall is impregnated with the refractive index adjusting substance together with the oscillation material in the impregnation step.

3. The method of fabricating a tubular laser light source according to claim 1, wherein
    the resin tube is an acrylic acid tube.

* * * * *